United States Patent
Hashmi et al.

[11] Patent Number: 6,161,081
[45] Date of Patent: Dec. 12, 2000

[54] SIMULATION MODEL FOR A DIGITAL SYSTEM

[75] Inventors: Muhammed Mutaher Kamal Hashmi; Nigel Rowland Crocker, both of Manchester; Alistair Crone Bruce, Stockport, all of United Kingdom

[73] Assignee: International Computers Limited, London, United Kingdom

[21] Appl. No.: 09/169,327

[22] Filed: Oct. 9, 1998

[30] Foreign Application Priority Data

Nov. 6, 1997 [GB] United Kingdom .................... 9723440

[51] Int. Cl.[7] ...................................... G06F 17/50

[52] U.S. Cl. ................................. 703/14; 703/18; 703/19; 703/20; 706/50; 716/2

[58] Field of Search ................................ 703/13, 14, 15, 703/16, 17, 19, 20; 716/2, 3, 5, 6, 16; 706/50; 371/22.3

[56] References Cited

U.S. PATENT DOCUMENTS

| | | |
|---|---|---|
| 5,696,771 | 12/1997 | Beausang et al. ...................... 371/22.3 |
| 5,805,462 | 9/1998 | Poirot et al. ......................... 395/500.19 |
| 5,838,583 | 11/1998 | Varadarajan et al. ................ 395/500.1 |
| 5,841,663 | 11/1998 | Sharma et al. ...................... 395/500.19 |
| 5,903,886 | 5/1999 | Heimlich et al. .......................... 706/50 |
| 5,910,898 | 6/1999 | Johannsen .......................... 395/500.02 |

*Primary Examiner*—Kevin J. Teska
*Assistant Examiner*—Samuel Broda
*Attorney, Agent, or Firm*—Lee, Mann, Smith, McWilliams, Sweeney & Ohlson

[57] ABSTRACT

A simulation model for a digital system comprises a number of functional units, interconnected by a number of interface units for transmitting messages between the functional units. Each interface unit includes a mechanism for automatically composing and decomposing messages into higher and lower levels of design. The interface thus provides a general mechanism which allows units at any level to communicate with units at any other level, for mixed-level modelling.

9 Claims, 5 Drawing Sheets

```
interface I1 is
between S,R;

type NT is array (0 to 4) of bit;
type BT is array (0 to 1) of NT;
type WT is array (0 to 1) of BT;

message NIBBLE(N : NT) is from S to R; end;

message BYTE(B : BT) is from S to R;
composition
serial
      NIBBLE(B(0));
      NIBBLE(B(1));
end;

message WORD(W : WT) is from S to R;
composition
serial
      BYTE(W(0));
      BYTE(W(1));
end;

protocol is
      WORD;
end;

end interface;
```

FIG. 3

```
Unit U1;
Interface Port IP : S of I1;
   ::
Variable Data : array(1 to 32) of BT;
   ::
      for i in 1 to 32 loop
            SEND IP.BYTE(Data(i));
      end loop;
```

```
Unit U2;
Interface Port IP : R of I1;
   ::
Variable Data : array(1 to 16) of WT;
   ::
      for i in 1 to 16 loop
            RECEIVE IP.WORD(Data(i));
      end loop;
```

```
Unit U3;
Interface Port IP : R of I1;
   ::
Variable Data : array(1 to 64) of NT;
   ::
      for i in 1 to 64 loop
            RECEIVE IP.NIBBLE(Data(i));
      end loop;
```

FIG. 4

SIMULATION MODEL FOR A DIGITAL SYSTEM

BACKGROUND TO THE INVENTION

This invention relates to techniques for simulating digital systems. The invention is particularly, although not exclusively, concerned with simulating the design of computer hardware, but could also be used in simulating other systems, such as complex software systems.

Design languages are known which allow the design of a digital system to be specified in terms of a number of functional units which communicate with each other by means of signals. One such language is VHDL [ANSI/IEEE Standard 1076].

Using such a language, functional units may be specified at different levels of complexity. Typically, each functional unit is initially specified at a high level, in very abstract terms, and then, as the design develops, is defined at increasingly detailed levels. It frequently turns out that the design of different units progresses at different rates: for example, in the design of a computer, the task of designing an I/O unit may be easier than that of designing the CPU or Store units, and so a lower level model of the I/O unit may become available before the equivalent models for the other units. The problem then arises of how to run the simulation model with different units at different levels.

One way of solving this problem is to use translators, for translating signals between different levels. For example, if the design consists of unit A at level 1 and unit B at level 2, then a translator could be used to translate the output signals from unit A to level 2 so that it may communicate with unit B. However, a problem with this is that such translators have to be hand-written, and require a substantial amount of effort to write and to validate. Indeed, the effort required to write and validate a translator is often greater than that for the unit itself.

The object of the present invention is to provide a way of allowing mixed-level modelling which overcomes these problems.

SUMMARY OF THE INVENTION

According to the invention a computerized simulation model for a digital system comprises:

(a) a plurality of functional units; and (b) a plurality of interface units for transmitting messages between the functional units;

(c) wherein each interface unit includes a mechanism for automatically composing and decomposing messages into higher and lower levels of design.

Each interface unit is preferably generated by compiling an interface definition, defining the messages passed by the interface at a number of different levels of design.

BRIEF DESCRIPTION OF THE DRAWINGS

FIG. 3 shows an interface specification for the interface unit of FIG. 2.

FIG. 4 shows a set of unit specifications for the functional units of FIG. 2.

DESCRIPTION OF AN EMBODIMENT OF THE INVENTION

One simulation model in accordance with the invention will now be described by way of example with reference to the accompanying drawings.

Overview

This embodiment of the invention makes use of a simulation language called VHDL+, which is an extension of the known VHDL language. VHDL allows a model to be specified in terms of a number of functional units and the signals between the units. In VHDL+, on the other hand, the model is considered to be a set of functional units which communicate with each other by way of interfaces. The interfaces are specified in terms of declarative definitions, which define the messages that can be sent between the functional units.

Figure 1:
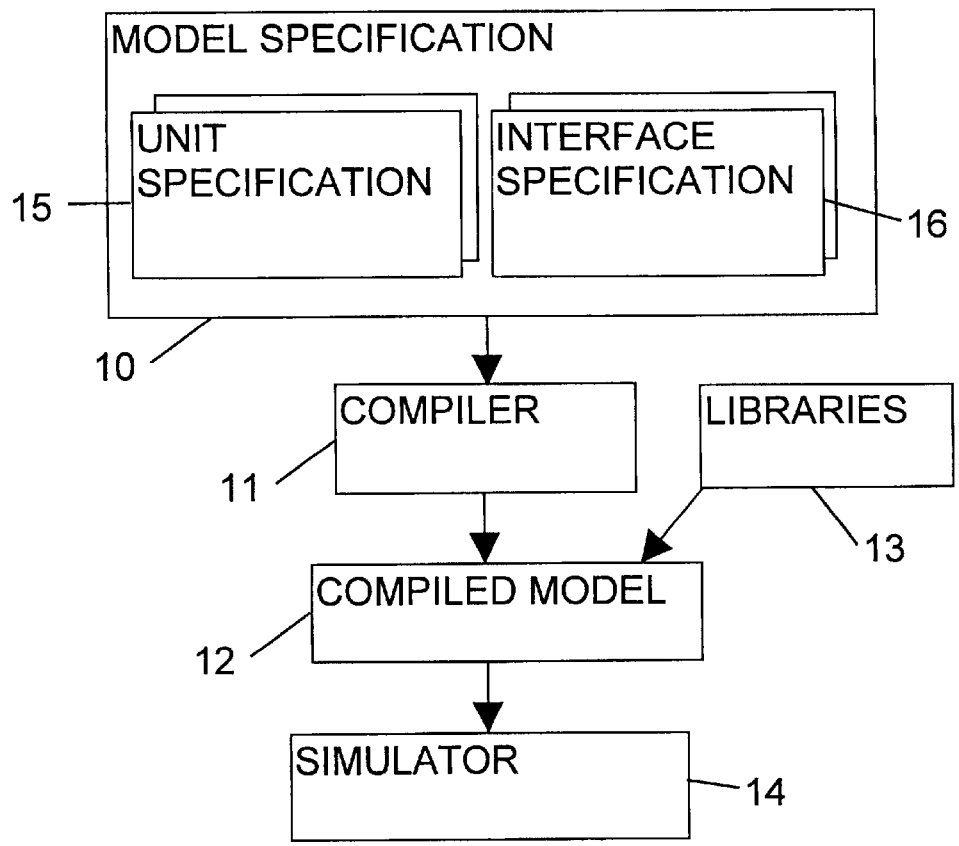
FIG. 1 is a block diagram showing a simulation model, and the way in which the model is compiled from a model specification.

FIG. 1 shows a model definition 10, which in this example is written in VHDL+. The model definition is processed by a compiler 11, to generate a compiled model 12, which in this example is in conventional VHDL. The compiled model is linked to conventional VHDL libraries 13. The compiled model can then be run on a simulator 14, which in this example is a conventional VHDL simulator.

Although the VHDL and VHDL+ languages are used in the present embodiment of the invention, it will be appreciated that other languages could be employed. For example, the compiler may produce a compiled model 12 in some other language such as C or C++.

As shown, the model definition 10, includes a number of unit specifications 15 and a number of interface specifications 16. The unit specifications specify a number of functional units, while the interface specifications specify interfaces in terms of the messages that may be passed between these units.

An Example

Figure 2:
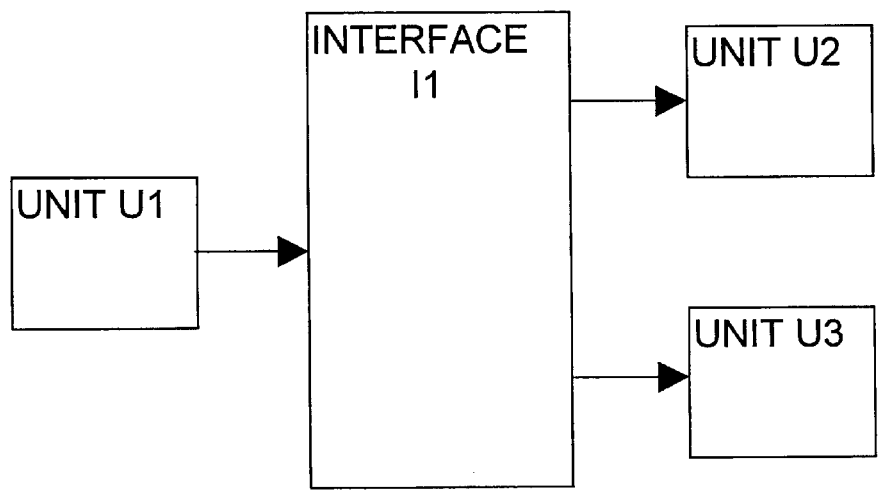
FIG. 2 is a block diagram showing a part of the model, comprising a number of functional units and an interface unit.

FIG. 2 shows a part of a compiled model, comprising three functional units U1, U2 and U3, interconnected by an interface unit I1. It is assumed that in this case unit U1 sends a message which is received by both units U2 and U3. It is also assumed that units U1, U2 and U3 are all defined at different design levels, as indicated schematically by their vertical positions in this figure. Unit U2 is at the highest (most abstract) level, and regards each message as a sequence of 16 words. Unit U1 is at the next highest level, and regards each word as a sequence of two bytes, so that each message consists of a sequence of 32 bytes. Unit U3 is at the lowest (most detailed) level, and regards each byte as consisting of two nibbles, so that each message consists of a sequence of 64 nibbles.

As will be shown, the interface I1 is capable of composing and decomposing messages to take account of these different levels. Specifically, in this example it composes the byte-oriented messages from U1 into word-oriented messages for U2, and also decomposes them into nibble-oriented messages for U3.

FIG. 3 shows the VHDL+ interface specification for I1. This interface specification defines a BYTE message as a composition of two nibble messages, NIBBLE(B(0)) and NIBBLE(B(1)), and defines a WORD message as a composition of two byte messages, BYTE(W(0)) and BYTE(W (1)). All the messages are specified as flowing from a send port S to a receive port R.

FIG. 4 shows the VHDL+unit specifications for units U1–U3. The first of these specifications indicates that unit U1 sends messages to the send port S of the interface unit I1, and that each message comprises a string of 32 bytes. The second of these specifications indicates that unit U2 receives messages from the receive port R of the interface unit I1, and that each message comprises a string of 16 words. The third of these specifications indicates that unit U3 receives messages from the receive port R of the interface unit I1, and that each message comprises a string of 64 nibbles.

Interface Unit

Figure 5:
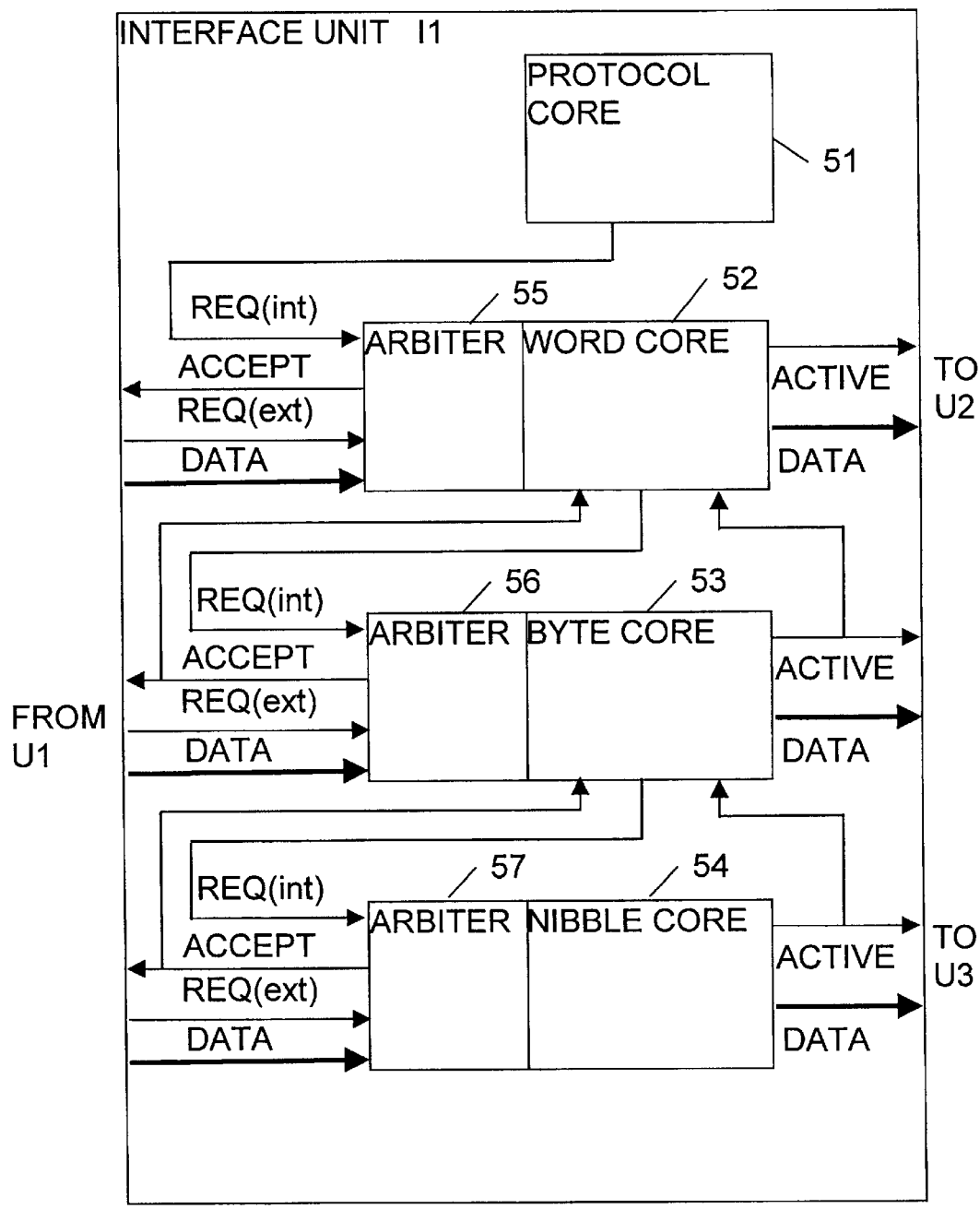
FIG. 5 is a block diagram showing the interface unit in more detail.

FIG. 5 shows the structure of the interface unit I1 of FIG. 2 in more detail.

The interface unit comprises a top-level protocol core module 51, and a number of further core modules 52–54, one for each defined level of the interface. In this example, the core modules comprise a word core module 52, a byte core module 53, and a nibble core module 54. The core modules 52–54 have respective arbiters 55–57, which receive external requests (REQext) and internal requests (REQint).

The external requests come from functional units that send messages through this interface. In this example, unit U1 sends an external request to the byte-level arbiter 56. Each arbiter may have only one one external request input. If multiple units send messages through the interface, other arbiters (not shown) are used to reduce the external requests to one.

The internal requests come from the higher-level core modules. For example, byte-level arbiter 56 receives a request from the word core module 52. There may be several internal request inputs to an arbiter; for example, the interface may contain other core modules (not shown) which also send requests to the nibble core 54.

An external request can take one of two values: Decompose or Inert. A Decompose request is a request from a sending unit (the unit U1 in this example), to send a data item through the interface. The request is accompanied by the data item to be sent (in this example, a byte of data). An Inert value merely indicates the absence of a Decompose request.

An internal request can take one of three values: Compose, Decompose or Inert. A Compose request indicates that requesting core module is ready to compose a higher-level data item, and requests the receiving core module to supply the next lower-level data item for this composition. For example, a Compose request from the word core 52 to the byte core 53 indicates that the word core is ready to receive a byte from the byte core, for assembly into a word. A Decompose request indicates that the requesting core module is decomposing a higher-level data item into a number of lower-level data items, and is accompanied by one of the lower-level data items. For example, a Decompose request from the Byte core 53 to the Nibble core 54 is accompanied by a nibble. An Inert value simply indicates the absence of either a Compose or Decompose request.

The function of an arbiter is to select one of a number of concurrent requests, and to pass that request to the associated core module, along with any associated data. The arbiter remembers which request it has selected, and passes back an ACCEPT signal to the unit which originated the request. The arbiter selects concurrent requests according to the following table:

| External request | Internal request | Output to core |
| --- | --- | --- |
| Inert | all Inert | Inert |
| Inert | any Compose, rest Inert | Compose |
| Inert | any Decompose | Decompose |
| Decompose | all Inert | Inert |
| Decompose | any Compose, rest Inert | Decompose |
| Decompose | any Decompose | Decompose |

Whenever one of the core modules is active, passing data across the interface, it raises an ACTIVE signal, which informs the receiving unit (if any) at this level that data is now available. The ACCEPT signal is also supplied to the higher-level core module (if any) within the interface. In this example, the word core 52 sends its active signal to the receiving unit U2, the byte core 53 sends its active signal to the word core, and the nibble core 54 sends its active signal to the byte core and to the receiving unit U3.

Core Module

Each of the core modules of FIG. 5 is a complex state machine, formed by connecting together a number of simpler state machines, representing the lower level messages into which a message at this level can be decomposed.

Figure 6:
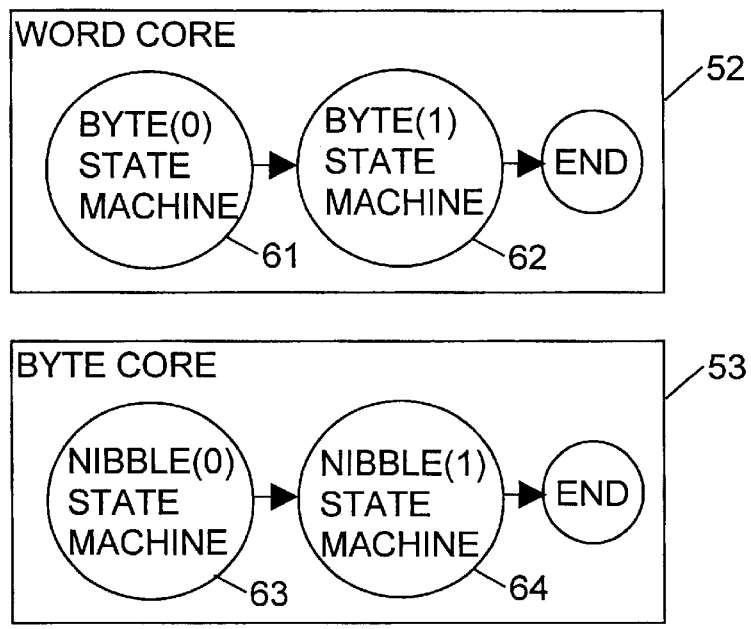
FIG. 6 is a block diagram showing the internal structure of core modules forming part of the interface unit.

Referring to FIG. 6, in the present example, the word core 52 comprises a byte(0) state machine 61 and a byte(1) state machine, connected in series, corresponding to the series of two bytes into which a word can be decomposed. Similarly, the byte core 53 comprises a nibble(0) state machine 63 and a nibble(1) state machine 64, connected in series, corresponding to the series of two nibbles into which a byte can be decomposed. The nibble core 54 does not contain any state machines, since a nibble cannot be decomposed any further in this example.

It should be noted that other patterns of connection between the state machines are possible. For example, if the interface specification defines a word as two bytes sent in parallel (instead of serially, as in the present example), the word core could consist of two byte state machines connected in parallel, with an AND gate to detect when both of these state machines have finished. Alternatively, if the interface specification requires that the first of two bytes received is to be sent, the word core could consist of two byte state machines connected in parallel, with an OR gate to detect when the first of these state machines has finished.

Generic State Machine

Figure 7:
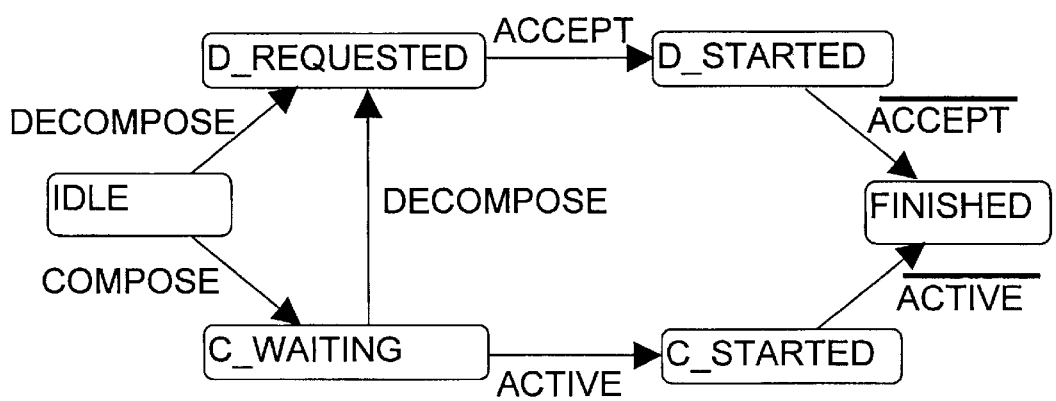
FIG. 7 is a state diagram showing a generic state machine, of which a number of instances are used in the core modules.

All the state machines 61–64 are instances of a generic state machine, as shown in FIG. 7. This comprises the following states: IDLE, D_REQUESTED, D_STARTED, C_WAITING, C_STARTED and FINISHED.

The IDLE state is entered when the state machine is initially invoked. In this state, the state machine waits for a Decompose or Compose request. If a Decompose request is received, the state machine sends a Decompose request to the next lower level of the interface, along with a data item, and then goes into the D_REQUESTED state. If a Compose request is received, the state machine sends a Compose request to the lower level, and then goes into the C_WAITING state.

In the D_REQUESTED state, the state machine waits for an ACCEPT signal to be returned from the lower level, indicating that the Decompose request has been accepted. It then goes into the D_STARTED state.

In the D_STARTED state, the state machine waits for the lower level to cancel its ACCEPT signal. It then goes into the FINISHED state.

In the C_WAITING state, the state machine waits for a Decompose request, or for an ACTIVE signal from the lower level. If a Decompose request is received, the state machine sends a Decompose request to the lower level along with a data item, and then goes into the D_REQUESTED state. If an ACTIVE signal is received, the state machine goes into the C_STARTED state.

In the C_STARTED state, the state machine waits for the ACTIVE signal from the lower level to be cancelled. It then reads in a data item from the lower level, and goes into the FINISHED state.

Operation of the Interface

The interface is initialised as follows. The protocol core 51 sends a Compose request to the word core 52. In response to this request, the byte(0) state machine in the word core sends a Compose request to the byte core, and goes into its C_WAITING state. In turn, the nibble(0) state machine in the byte core then sends a Compose request to the nibble core, and also goes into its C_WAITING state. The compose request to the nibble core is discarded, since the nibble core does not contain any state machine.

When the unit U1 requires to send a message to units U2 and U3, it sends a series of bytes to the arbiter 56 of interface I1. Each byte is accompanied by a Decompose request.

In response to the first Decompose request, the nibble(0) state machine sends a Decompose request to the-nibble core 54, along with the first nibble of the byte, and goes into its D_REQUESTED state. The byte core then raises its ACTIVE signal to indicate that it is now active, and the arbiter 56 raises its ACCEPT signal, to inform U1 that the request has been accepted.

When it receives the ACTIVE signal from the byte core, the byte(0) state machine in the word core goes into its C_STARTED state, and the word core becomes active. Unit U2, which was waiting for the word core to go active, now starts to receive data.

In response to the Decompose request from the byte core, the nibble core 54 goes active. Unit U3, which was waiting for the nibble core to go active, now starts to receive data. The arbiter 57 raises its ACCEPT signal to indicate that the Decompose request has been accepted.

The ACCEPT signal from arbiter 57 causes the nibble(0) state machine to go into its D_STARTED state. Then, when the ACCEPT signal goes false, the nibble(0) state machine goes into its FINISHED state. This activates the nibble(1) state machine.

Because the byte core is still receiving the original Decompose request, the nibble(1) state machine goes into its D_REQUESTED state, and sends another Decompose request to the nibble core 54, along with the second nibble of the byte. As before, the arbiter 57 raises its ACCEPT signal to indicate that the Decompose request has been accepted. The ACCEPT signal causes the nibble(1) state machine to go into its D_STARTED state. Then, when the ACCEPT signal goes false, the nibble(1) state machine goes into its FINISHED state.

When the nibble(1) state machine has finished, the byte core cancels its ACTIVE signal, and also cancels the ACCEPT signal to U1. Cancellation of the ACTIVE signal causes the byte(0) state machine to transfer the first byte into the word core, and to go into its FINISHED state, activating the byte(1) state machine.

It can be seen that the operation so far has decomposed the first byte into two nibbles and transferred them to unit U3, while the word core has read in one byte. The interface is now nearly back in its initial state, except that the word core is still active, with its byte(1) state machine in the C_WAITING state, waiting for U1 to send the second byte.

When U1 sends the second byte, the above steps are repeated. This time, when the byte(1) state machine goes into its FINISHED state, the word core goes inactive, and the receiving unit U2 completes its reception of the word.

The above operation is repeated for each successive pair of bytes in the message.

Discussion

It can be seen that the interface described above provides a general mechanism which allows units at any level to communicate with units at any other level. For example, the same interface could be used to allow a top-level (word-oriented) unit to send messages to a bottom-level (nibble-oriented) unit.

The state machines in the interface automatically control whether a message should be composed or decomposed according to its current environment, and facilitate the correct flow of information up and/or down the hierarchy of the interface.

Some possible modifications

It will be appreciated that many modifications may be made to the system described above without departing from the scope of the present invention. For example, different design specification languages and different simulators could be used. Moreover, it will be appreciated that the interface hierarchy described above, based on words, bytes and nibbles, is merely an example, and many other ways of decomposing messages could be specified.

What is claimed is:

1. A computerized simulation model for a digital system, said model comprising:

(a) a plurality of functional units; and
 (b) a plurality of interface units for transmitting messages between the functional units;
 (c) wherein each interface unit includes a mechanism for automatically composing and decomposing said messages into higher and lower levels of design abstraction.

2. A simulation model according to claim 1 wherein said mechanism comprises a plurality of core modules, one for each of said levels of design abstraction, and means operative on receipt of a message from one of the functional units at a particular level of design abstraction, to send a compose request to all core modules at a level of design abstraction higher than said particular level of design abstraction, and to send a decompose request to all core modules at a level of design abstraction lower than said particular level of design abstraction.

3. A simulation model according to claim 2 wherein at least one of said core modules comprises a plurality of state machines, representing lower-level data items into which a data item at the level of this core module is to be decomposed.

4. A simulation model according to claim 3 wherein each of said state machines comprises:

(a) means operative upon receipt of a decompose request, to send a further decompose request to a lower-level module, along with a data item appropriate to that lower level, and then to wait until that further decompose has been accepted by the lower-level module before finishing, and
 (b) means operative upon receipt of a compose request, to wait until a lower-level module has accepted a new data item and then to read in a data item from that lower-level module.

5. A method of operating a computer to simulate a digital system, comprising the steps:

(a) generating in said computer a simulation model comprising a plurality of functional units and a plurality of interface units for transmitting messages between the functional units, and (b) in each interface unit, automatically composing and decomposing said messages into higher and lower levels of design abstraction.

6. A method according to claim 5 wherein each of said interface units comprises a plurality of core modules, one for each of the levels of design abstraction, the method comprising the further steps:

(a) passing a message from one of said functional units at a particular level of design abstraction;

(b) passing a compose request to all core modules at a level of design abstraction higher than said particular level of design abstraction; and (c) passing a decompose request to all core modules at a level of design abstraction lower than said particular level of design abstraction.

7. A method according to claim 6 wherein at least one of said core modules comprises a plurality of state machines, representing lower-level data items into which a data item at the level of this core module is to be decomposed, said method comprising the further steps:

(a) operating each state machine, on receipt of a decompose request, to send a further decompose request to a lower-level module, along with a data item appropriate to that lower level, and then to wait until that further decompose request has been accepted by the lower-level module before finishing; and (b) operating each state machine upon receipt of a compose request, to wait until a lower-level module has accepted a new data item and then read in a data item from that lower-level module.

8. A method according to claim 5 including the steps:

(a) providing an interface definition, defining the messages passed by the interface at a plurality of different levels of design abstraction; and (b) generating each interface unit by compiling said interface definition.

9. A computer-readable storage medium embodying program instructions for performing a method of operating a computer to simulate a digital system, the method comprising the steps:

(a) generating in said computer a simulation model comprising a plurality of functional units and a plurality of interface units for transmitting messages between the functional units, and (b) in each interface unit, automatically composing and decomposing said messages into higher and lower levels of design abstraction.

\* \* \* \* \*